US007947426B2

(12) United States Patent
Figov et al.

(10) Patent No.: US 7,947,426 B2
(45) Date of Patent: May 24, 2011

(54) LASER-ENGRAVEABLE FLEXOGRAPHIC PRINTING PLATE PRECURSORS

(75) Inventors: Murray Figov, Ra'anana (IL); Yariv Y. Pinto, Petach Tikva (IL)

(73) Assignee: Eastman Kodak Company, Rochester, NY (US)

( * ) Notice: Subject to any disclaimer, the term of this patent is extended or adjusted under 35 U.S.C. 154(b) by 568 days.

(21) Appl. No.: 12/036,326

(22) Filed: Feb. 25, 2008

(65) Prior Publication Data

US 2009/0214983 A1 Aug. 27, 2009

(51) Int. Cl.
*G03F 7/09* (2006.01)
*G03C 1/76* (2006.01)

(52) U.S. Cl. ...................... 430/302; 430/270.1; 430/944

(58) Field of Classification Search ............... 101/463.1; 430/270.1, 302, 306, 906, 912, 944
See application file for complete search history.

(56) References Cited

U.S. PATENT DOCUMENTS

| | | | | |
|---|---|---|---|---|
| 3,865,588 | A * | 2/1975 | Ohto et al. | 430/18 |
| 3,873,477 | A * | 3/1975 | Beck et al. | 521/93 |
| 5,278,023 | A | 1/1994 | Bills et al. | 430/201 |
| 5,542,017 | A * | 7/1996 | Koike | 385/123 |
| 5,798,202 | A | 8/1998 | Cushner et al. | 430/306 |
| 6,090,529 | A | 7/2000 | Gelbart | 430/306 |
| 6,245,486 | B1 * | 6/2001 | Teng | 430/303 |
| 6,935,236 | B2 | 8/2005 | Hiller et al. | 101/401.1 |
| 2002/0018958 | A1 * | 2/2002 | Nishioka et al. | 430/260 |
| 2003/0180636 | A1 | 9/2003 | Kanga et al. | 430/18 |
| 2004/0231540 | A1 | 11/2004 | Hiller | 101/401.1 |
| 2005/0277061 | A1 | 12/2005 | Nishioka et al. | 430/300 |
| 2006/0049551 | A1 * | 3/2006 | Hanada et al. | 264/553 |
| 2006/0078826 | A1 * | 4/2006 | Sonokawa | 430/302 |

FOREIGN PATENT DOCUMENTS

| | | |
|---|---|---|
| EP | 1 228 864 | 8/2002 |
| WO | 94/01280 | 1/1994 |
| WO | 2005/084959 | 9/2005 |

OTHER PUBLICATIONS

U.S. Appl. No. 11/782,687, filed Jul. 26, 2007, ,titled Ablatable Elements for Making Flexographic Printing Plates, by Michael T. Regan et al.

* cited by examiner

*Primary Examiner* — Cynthia H Kelly
*Assistant Examiner* — Anca Eoff
(74) *Attorney, Agent, or Firm* — J. Lanny Tucker

(57) ABSTRACT

Laser-engraveable flexographic printing plate precursors have a laser-engraveable elastomeric layer that comprises a non-free radical crosslinked polymeric binder, an infrared radiation absorbing compound, and a compound that remains stable in the precursor but upon imaging thermally degrades to produce gaseous products. The thermally degradable compounds can generate or liberate one or more gases such as nitrogen and carbon dioxide.

16 Claims, No Drawings

LASER-ENGRAVEABLE FLEXOGRAPHIC PRINTING PLATE PRECURSORS

FIELD OF THE INVENTION

This invention relates to laser-ablatable (or laser engraveable) elements that can be used to prepare flexographic printing plates. It also relates to an imaging method for making such flexographic printing plates.

BACKGROUND OF THE INVENTION

Flexography is a method of printing that is commonly used for high-volume printing runs. It is usually employed for printing on a variety of substrates particularly those that are soft, flexible, or easily deformed, such as paper, paperboard stock, corrugated board, polymeric films, fabrics, metal foils, and laminates. Course surfaces and stretchable polymeric films can be economically printed by the means of flexography.

Flexographic printing plates are sometimes known as "relief printing plates" and are provided with raised relief images onto which ink is applied for making ink impressions on the printed substrates. The raised relief images are inked in contrast to the relief "floor" that remains free of ink during printing. Such printing plate precursors are generally supplied to the user as one or more layers on a suitable backing or substrate. Flexographic printing is often carried out using a flexographic printing cylinder or seamless sleeve having a desired relief image.

Flexographic printing plates have been prepared in a number of ways. Initially, the images were cut into a sheet of rubber with a knife. An improvement was achieved by forming a mold that could be produced by photo-etched graphics and then by pouring molten rubber or elastomer into the mold and vulcanizing it to form the printing plate precursor. More recently, relief images have been prepared by exposing a photosensitive composition coated onto a substrate through a masking element or transparency and then removing non-exposed regions of the coating with a suitable solvent. Various photosensitive compositions are known for this purpose and usually utilize some type of polymerization, for example, using free radicals.

Direct laser engraving is described in a number of publications including U.S. Pat. Nos. 5,798,202 and 5,804,353 (Cushner et al.) in which various means are used to reinforce the elastomeric layers. Laser-engraveable elements may also include hydrocarbon-filled plastic and heat-expandable microspheres as described in U.S. Patent Application Publication 2003/0180636 (Kanga et al.).

Direct laser engraving innovations often employ the use of carbon dioxide laser or near infrared diodes. In the former case, the radiation of the laser beam is at 10.7 μm and is absorbed by the polymeric materials that are present. In the case of the near infrared imaging sources such as diode lasers, an absorbing material such as a dye or pigment must be present because in general, polymers do not absorb in that part of the spectrum.

Flexographic printing plate precursors that are to be imaged using near infrared ablation need an elastomeric or polymeric imaging layer that is preferably prepared by a polymerization reaction and includes appropriate fillers and infrared radiation (IR) absorbing compounds such as carbon black.

Thermoplastic materials that have not been crosslinked to form a thermoset material have been found to have limited suitability because ablation of thermoplastic materials tends to cause melting of non-ablated regions around the ablated regions and re-deposits ablated debris in the ablated regions.

U.S. Pat. No. 5,278,023 (Bills et al.) describes non-flexographic laser ablation systems that image various elements containing "propellants" that improve decomposition during ablation. For example, the patent describes the use of propellants in laser donor materials to assist the transfer of an image to a suitable receiver material.

Waterless offset printing plates are described in WO 1994/01280 (Gates et al.) in which gas-producing materials ("blowing agents") such as sulfonyl hydrazide and azodicarbonamide are included to encourage thermal degradation of the thin printing plate layers. These additives are incorporated into suitable decomposable polymers.

As noted above, the use of powerful IR lasers enables higher quality and more reliable engraving compared to the older carbon dioxide lasers. There is a desire to optimize imaging speed or sensitivity by finding better imaging compositions that can be successfully imaged using IR-laser ablation. IR lasers usually require the presence of IR-absorbing dyes or pigments, but if the laser-ablatable layer includes thermoset polymers, they must be polymerized in a manner that is not affected by the IR dye or pigment, or conversely affects the IR dye or pigment. This is a formidable task as the imaging layer is quite thick, for example up to 6 mm. For example, if curing is carried out using free radical chemistry, polymerization can act on the IR dye so that it no longer absorbs in the infrared region. On the other hand, if carbon black or iron oxide is used in place of the IR dye, polymerization of the relatively thick laser-ablatable layer using UV light is extremely difficult.

A number of elastomeric imaging compositions have been formulated for making flexographic printing plates. They have generally been UV-radiation sensitive compositions as evidenced by EP 1,228,864A1 (Houstra) and U.S. Pat. No. 5,798,202 (noted above) and U.S. Pat. No. 6,935,236 (Hiller et al.). UV curing has a number of disadvantages and is difficult to use with relatively thick laser-ablatable layers. While many polymers have been suggested for use in flexographic printing plate precursors, only elastomers are useful in practice because they can be bent around printing cylinders and secured with temporary bonding that fix the plate during printing and can be removed after printing.

As far as printing plates precursors are concerned, the use of "blowing agents" or propellants has been confined to reaction during precursor fabrication (for example, heat, UV, or electron beam curing). Because of their reactivity under free radical conditions, one would not expect such compounds to be useful during laser ablation of such precursors. They may have been used in thin, solvent-deposited layers but the expectation is that they would be useless in thick flexographic laser-ablatable layers especially in the presence of free radicals. For example, WO 2005/084959 (Figov) reports that the presence of peroxide causes "blowing agents" to decompose. Thus, there are reasons given in the art to avoid their use in laser-ablatable flexographic printing plates.

Problem to be Solved

There is a continuing need to provide flexographic printing plate precursors with greater imaging sensitivity. If "blowing agents" or propellants can be used for this purpose, there is a need to have imaging compositions in which such compounds are not prematurely reacted or decomposed before laser ablation.

SUMMARY OF THE INVENTION

This invention provides a laser-engraveable flexographic printing plate precursor comprising a laser-engraveable elastomeric layer that comprises a non-free radical crosslinked polymeric binder, an infrared radiation absorbing compound, and a compound that remains stable in the precursor but upon imaging thermally degrades to produce gaseous products.

This invention also provides a method of producing a flexographic printing plate, which method comprises imaging the laser-engraveable flexographic printing plate precursor of this invention by exposing it with a laser or laser array having a minimum output of at least 3 watts.

This invention avoids certain problems associated with known laser-ablatable compositions used to make flexographic printing plates. Higher imaging sensitivity is achieved by using "blowing agents", propellants, or both in the laser-engraveable elastomeric layer composition after it has been formulated. As a result, the relief image is more sharply delineated as there is less melting on the edges and a more even relief floor. Premature reaction of such thermally degradable compounds is avoided by fabricating the flexographic printing plate precursors through crosslinking by ionic reactions instead of free radical reactions.

DETAILED DESCRIPTION OF THE INVENTION

Definitions

The term "laser-engraveable flexographic printing plate precursor" used herein includes any imageable element or material of any form in which a relief image can be produced using a laser according to the present invention. In most instances, however, such elements are used to form flexographic printing plates (flat sheets) or flexographic printing sleeves with a relief image having a depth of at least 200 μm. Such laser-engraveable flexographic printing plate precursors may also be known as "flexographic printing plate blanks" or "flexographic sleeve blanks". The laser-engraveable flexographic printing plate precursors can also be in the form of seamless continuous forms.

By "ablative", or "laser-engraveable", we mean that the laser-engraveable elastomeric layer can be imaged using a radiation source (such as a laser) that produces heat within the layer that causes rapid local changes in the layer so that the imaged regions are chemically decomposed and physically detached from the rest of the layer and/or substrate and ejected from the layer. Non-imaged regions of the laser-engraveable layer are not removed or volatilized to an appreciable extent and thus form the upper surface of the relief image. In the present invention, materials are broken down into small fragments (small molecular weight compounds) and gaseous products that are ejected from the layer and appropriately collected. The breakdown is a violent process that includes eruptions, explosions, tearing, decomposition, volatilization, fragmentation, or other destructive processes that create a broad collection of materials including one or more gases. This is distinguishable from, for example, image transfer. "Laser-engraving" is also known as "ablation engraving" in this art. It is also distinguished from image transfer methods in which melting and sublimation as well as ablation may all be involved to materially form an image by transferring pigments, colorants, or other image-forming components.

Unless otherwise indicated, the term "weight %" refers to the amount of a component or material based on the total dry layer weight of the composition or layer in which it is located.

Laser-Engraveable Elements

The laser-engraveable flexographic printing plate precursors include a suitable dimensionally stable substrate and at least one laser-engraveable elastomeric layer disposed thereon. Suitable substrates include dimensionally stable polymeric films, aluminum sheets or cylinders, foams, fiberglass, fabrics, or laminates of polymeric films and metal sheets (such as a laminate of a polyester and aluminum sheet or polyester/polyamide laminates, or a laminate of a polyester film and a compliant or adhesive support). Polyester, polycarbonate, polyvinyl, and polystyrene films are typically used. Useful polyesters include but are not limited to poly(ethylene terephthalate) and poly(ethylene naphthalate). The substrates can have any suitable thickness, but generally they are at least 0.01 mm or from about 0.05 to about 0.3 mm thick, especially for the polymeric substrates. An adhesive layer may be used to secure the laser-engraveable layer to the substrate.

There may be a backcoat on the non-imaging side of the substrate (if present) that may be composed of a soft rubber or foam, or other compliant layer. This backcoat may be present to provide adhesion between the substrate and the printing press rollers and to provide extra compliance to the resulting flexographic printing plate.

The laser-engraveable flexographic printing plate precursor is positive-working whereby the areas corresponding to non-print background regions are removed with the laser-engraving. The element contains one or more layers. That is, it can contain multiple layers, at least one of which contains a laser-engraveable elastomeric material as described below.

In most embodiments, the laser-engraveable elastomeric layer is the outermost layer, including embodiments where the layer is disposed on a printing cylinder. However, in some embodiments, the laser-engraveable elastomeric layer can be located underneath an outermost capping smoothing layer that provides additional smoothness or better ink reception and release. This capping smoothing layer can have a general thickness of from about 1 to about 100 μm.

In general, the laser-engraveable elastomeric layer has a thickness of at least 0.2 mm and generally from about 0.2 to about 6 mm, and typically from about 0.7 to about 3 mm.

The laser-engraveable elastomeric layer comprises one or more non-free radical crosslinked polymeric binders, each of which is a polymer derived from the reaction of a polyol and a polyisocyanate. For example, crosslinked polymeric binders can be polymers derived from the reaction of a diol, triol, or mixture thereof, with a diisocyanate, triisocyanate, or mixture thereof.

Examples of such polyols include but are not limited to, the products sold under the tradename Desmophen® by Bayer MaterialScience, including poly{(2-methyl)-1,3-propylene adipate}diol and poly(tetrahydrofuran carbonate)diol.

Examples of useful polyisocyanates include but are not limited to, hexamethylene diisocyanate, diphenylmethane diisocyanate, bis(4-isocyanatocyclohexyl)methane, 2,4-tolylene diisocyanate, and compounds sold under the tradename Desmodur® by Bayer MaterialScience (for example, the hexamethylene diisocyanate).

The polyols and polyisocyanates may be reacted in the presence of such non-free radical catalysts as dibutyl tin dilaurate, DABCO 33LV (Air Products and Chemicals), Polycat SA-1/10 (also from Air Products and Chemicals), and 1,4-diazobicyclo(2,2,2)octane.

The polymeric binder derived from the reaction of a diol and a diisocyanate will generally be present in an amount of at least 20 weight % and up to 90 weight % of the dry layer weight.

The laser-engraveable layer also includes one or more compounds that thermally degrade to produce gases in an amount of at least 2 and up to 30 weight % (typically from about 5 to about 20 weight %), in an amount sufficient to generate or liberate the gases noted below. These compounds are stable while in the precursor, but they have a group that upon thermal imaging (or exposure to heat for example at or above 160° C.) generates or liberates one or more gases. Usually, the liberated or generated gas is nitrogen, carbon dioxide, water vapor, or a mixture of gases. In most embodiments, nitrogen is the predominant gas that is produced as the thermally degradable compound contains nitrogen (for example, one or more azido, nitroso, nitro, nitrate, tetrazole or nitro groups).

More likely, nitrogen-containing compounds are used as thermally degradable compounds including but not limited to:

nitroso compounds such as N,N'-dinitrosopentamethylene tetramine, sulfonyl hydrazides such as benzenesulfonylhydrazide, p,p'-oxy-bis(benzene sulfonylhydrazide), p-toluene sulfonylhydrazide, and p-toluene sulfonyl semicarbonamide, azo compounds such as azodicarbonamide, azocarbonic acid diazide, Unicell (Donjing), Porofor® (Lanxess), and azides such as glycidyl azide polymers.

Some useful thermally degradable polymers that release nitrogen are described for example in U.S. Pat. No. 5,278,023 (Bills et al.), in Cols. 6 and 7 with Formula (I) and that are incorporated herein by reference.

The laser-engraveable layer can also comprise one or more radiation absorbing materials that absorb IR (or thermal) radiation and transfer the exposing photons into thermal energy. Particularly useful radiation absorbing materials are infrared radiation absorbing materials that are responsive to exposure from IR lasers. Mixtures of the same or different types of infrared radiation absorbing material can be used if desired.

A wide range of infrared radiation absorbing materials are useful in the present invention, including carbon blacks and other IR-absorbing pigments (including squarylium, cyanine, merocyanine, indolizine, pyrylium, metal phthalocyanines, and metal dithiolene pigments), and metal oxides. Examples include RAVEN 450, 760 ULTRA, 890, 1020, 1250 and others that are available from Columbian Chemicals Co. (Atlanta, Ga.) as well as BLACK PEARLS 170 , BLACK PEARLS 480, VULCAN XC72, BLACK PEARLS 1100, and carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful carbon blacks are Mogul L, Mogul E, Emperor 2000, and Regal 330, and 400, all from Cabot Corporation (Boston Ma.). Other useful pigments include, but are not limited to, Heliogen Green, Nigrosine Base, iron (III) oxides, transparent iron oxides, magnetic pigments, manganese oxide, Prussian Blue, and Paris Blue. Other useful IR absorbers are carbon nanotubes, such as single- and multi-walled carbon nanotubes, graphite, and porous graphite.

Although the size of the IR absorbing pigment or carbon black is not critical for the purpose of the invention, it should be recognized that a finer dispersion of very small particles will provide an optimum ablation feature resolution and ablation sensitivity. Particularly suitable are those with diameters less than 1 μm.

Dispersants and surface functional ligands can be used to improve the quality of the carbon black or metal oxide, or pigment dispersion so that uniform incorporation of the IR absorber throughout the laser-engraveable layer can be achieved.

Other useful infrared radiation absorbing materials (such as IR dyes) are described in U.S. Pat. No. 4,912,083 (Chapman et al.), U.S. Pat. No. 4,942,141 (DeBoer et al.), U.S. Pat. No. 4,948,776 (Evans et al.), U.S. Pat. No. 4,948,777 (Evans et al.), U.S. Pat. No. 4,948,778 (DeBoer), U.S. Pat. No. 4,950,639 (DeBoer et al.), U.S. Pat. No. 4,950,640 (Evans et al.), U.S. Pat. No. 4,952,552 (Chapman et al.), U.S. Pat. No. 4,973,572 (DeBoer), U.S. Pat. No. 5,036,040 (Chapman et al.), and U.S. Pat. No. 5,166,024 (Bugner et al.).

The radiation absorbing material(s) are present in the laser-engraveable layer generally in an amount of at least 1 weight %, and typically from about 2 to about 20 weight %.

In order to facilitate ablation to desired relief depth, it may be useful to include inert or "inactive" particulate materials, inert or "inactive" microspheres, a foam or porous matrix, or similar microvoids in the laser-engraveable layer. For example, as described in U.S. Pat. No. 6,159,659 (Gelbart), inert glass or microspheres may be dispersed within the polymeric binder. Other inert materials may be included if they contribute to a better relief image. Such inert materials do not react in any fashion and thus keep their chemical composition, but they provide centers for loosening the laser-engraveable materials upon thermal imaging, or alter the physical properties of the laser-engraveable layer in such a way that cleaner ablation edges can be obtained. Particulate additives include solid and porous fillers, which can be organic or inorganic (such as metallic) in composition. Examples of inert solid particles are silica and alumina, and particles such as fine particulate silica, fumed silica, porous silica, surface treated silica, sold as Aerosil from Degussa and Cab-O-Sil from Cabot Corporation, and micropowders such as amorphous magnesium silicate cosmetic microspheres sold by Cabot and 3M Corporation.

Inert microspheres can be hollow or filled with an inert solvent, and upon thermal imaging, they burst and give a foam-like structure or facilitate ablation of material from the laser-engraveable layer because they reduce the energy needed for ablation of the layer materials. Inert microspheres are generally formed of an inert polymeric or inorganic glass material such as a styrene or acrylate copolymer, silicon oxide glass, magnesium silicate glass, vinylidene chloride copolymers.

The microspheres should be stable during the manufacturing process of the laser-ablatable element, such as under extrusion conditions. Yet, in some embodiments, the microspheres are able to collapse under imaging conditions. Both unexpanded microspheres and expanded microspheres can be used in this invention. The amount of microspheres that may be present is from about 1 to about 30 weight % of the dry laser-engraveable layer. Generally, the microspheres comprise a thermoplastic shell that is either hollow inside or enclosing a hydrocarbon or low boiling liquid. For example, the shell can be composed of a copolymer of acrylonitrile and vinylidene chloride or methacrylonitrile, methyl methacrylate, or a copolymer of vinylidene chloride, methacrylic acid, and acrylonitrile. If a hydrocarbon is present within the microspheres, it can be isobutene or isopentane. EXPANCEL® microspheres are commercially available from Akzo Noble Industries (Duluth, Ga.). Dualite and Micropearl polymeric microspheres are commercially available from Pierce & Stevens Corporation (Buffalo, N.Y.). Hollow plastic pigments are available from Dow Chemical Company (Midland, Mich.) and Rohm and Haas (Philadelphia, Pa.).

When unexpanded microspheres are heated during imaging, the shell softens and the internal hydrocarbon expands causing the shell to stretch and expand also. When heat is removed, the shell stiffens and the expanded microspheres remain in their expanded form. Unexpanded microspheres generally retain the same size and shape during and after imaging.

Optional addenda in the ablatable layer can include but are not limited to, plasticizers, dyes, fillers, antioxidants, antiozonants, dispersing aids, surfactants, and adhesion promoters, as long as they do not adversely interfere with laser-engraving efficiency.

The laser-engraveable flexographic printing plate precursor can be prepared in various ways, for example, by coating, spraying, or vapor depositing the laser-engraveable layer formulation onto the substrate out of a suitable solvent and drying. Alternatively, the laser-engraveable layer can be press-molded, injection-molded, melt extruded, extruded then heat-calendered, or co-extruded into an appropriate layer or ring (sleeve) and adhered or laminated to the substrate and cured to form a continuous layer, flat or curved sheet, or seamless printing sleeve. The layer in sheet-form can be wrapped around a printing cylinder and fused at the edges to form a seamless flexographic printing sleeve.

The laser-engraveable flexographic printing plate precursor may also be constructed with a suitable protective layer or slip film (with release properties or a release agent) in a cover sheet that is removed prior to laser engraving. Such protective layers can be a polyester film [such as poly(ethylene terephthalate)] to form a cover sheet.

A backing layer on the substrate side opposite the laser-engraveable layer can also be present that may be reflective of imaging radiation or transparent to it.

Laser-Engraving

Ablation (engraving) energy is generally applied using a suitable imaging laser or laser array such as $CO_2$ or infrared radiation-emitting diodes or YAG lasers or laser array. Engraving to provide a relief image with a depth of at least 200 μm is desired with a relief image having a depth of from about 300 to about 1000 μm being desirable. The relief image may have a maximum depth up to about 100% of the original thickness of the laser-engraveable layer when a substrate is present. In such instances, the floor of the relief image may be the substrate (if the laser-engraveable layer is completely removed in the imaged regions), a lower region of the ablatable layer, or an underlayer such as an adhesive layer or compliant layer. An IR diode laser or laser array operating at a wavelength of from about 700 to about 1200 nm is generally used, and a diode laser or laser array operating at from 800 nm to 1200 nm is especially useful for ablative imaging (engraving) in this invention.

Generally, engraving is achieved using an infrared radiation laser or laser array having a minimum output of at least 3 watts, or at an energy level of at least 1 J/cm$^2$, and typically infrared imaging at from about 50 to about 1500 J/cm$^2$.

Engraving to form a relief image can occur in various contexts. For example, sheet-like elements can be imaged and used as desired, or wrapped around a printing cylinder or cylinder form before imaging. The element can also be a printing sleeve that can be imaged before or after mounting on a printing cylinder.

During imaging, some by-products of engraving are gaseous or volatile and are readily collected by vacuum for disposal or chemical treatment. Any solid debris can be similarly collected using vacuum or washing.

During printing, the printing plate is inked using known methods and the ink is appropriately transferred to a suitable substrate such as paper, plastics, fabrics, paperboard, or cardboard.

In the case where the flexographic precursor is in the form of a sleeve, after printing, the imaged sleeve can be cleaned and the engraved surface removed by grinding. The fresh surface can then be exposed to laser ablation and the new image printed.

The following Examples are provided to illustrate the practice of this invention and are not meant to be limiting in any way. Unless otherwise indicated, the components used in the examples were obtained from one or more readily available commercial sources.

EXAMPLES

Comparative Example 1

A flexographic printing plate precursor was prepared using the Formulation A components shown below in TABLE I (all percentages are by weight).

TABLE I

| | |
|---|---|
| CN9170 urethane diacrylate oligomer (Cray Valley) | 25.84% |
| Ebecryl ® 1259 (diluted urethane triacrylate oligomer from UCB Chemicals) | 6.79% |
| Isobornyl acrylate | 17.05% |
| Carbon black | 7.75% |
| Cumene hydroperoxide (88%) | 2.73% |
| Oleyl alcohol | 6.36% |
| Magnesium oxide | 13.39% |
| Fumed silica | 7.29% |
| Ebecryl ® 113 acrylate (UCB Chemicals) | 6.77% |
| Polyester-block polyether diol (Aldrich Chemical Co.) | 6.00% |

Formulation A was made up, pasted into a mold, sealed and crosslinked by heating at 160° C. for one hour. The resulting flexographic printing plate precursor was measured for sensitivity by laser ablation at 910 nm. The sensitivity was found to be 0.55 J/cm$^2$/μm. The flexographic printing plate had a Durometer A hardness of 67.

A similar formulation was prepared by further adding 10% azodicarbonamide (as a "blowing agent") to Formulation A and the resulting paste was cured in a similar manner to form a flexographic printing plate that was softer, having a Durometer hardness of 45 and many bubbles formed from the decomposition of the azodicarbonamide. The sensitivity from laser ablation was found to be 0.68 J/cm$^2$/μm.

Still additional similar formulations were prepared by adding each of the following compounds as "blowing agents" to Formulation A:

- 20% of azodicarbonamide,
- 30% of azodicarbonamide,
- 1% of Genitron EPC (formulated azocarbonic acid diazide),
- 10% of GAP (glycidyl azide polymer).

All of these formulations, when formulated like Formulation A and polymerized provided flexographic printing plate precursors that were full of bubbles and had a low Durometer hardness and/or poor sensitivity to laser imaging. These results indicate that the introduction of the "blowing agents" was detrimental to the properties and performance of the resulting flexographic printing plates that were formed using acrylate-based formulations and free radical reactions.

Note that for instance, azodicarbonamide, when heated to 160° C. as described in this Example, should not decompose. However, in the presence of free radicals produced during curing of the formulation, the azodicarbonamide was destabilized and did decompose.

Comparative Example 2

A flexographic printing plate precursor was prepared using the Formulation B components shown below in TABLE II (all percentages are by weight).

TABLE II

| | |
|---|---|
| Desmodur ® N3300A (Bayer MaterialScience) | 17.31% |
| Mogul ® L carbon black (Cabot Corporation | 9.11% |
| Cab-O-Sil M5 (fumed silica particles from Cabot) | 9.16% |
| DBTDL (dibutyl tin dilaurate) | 0.66% |
| Desmophen ® C2200 polyester resin (Bayer MaterialScience) | 63.76% |

Formulation B was mixed without the DBTDL and the pigment was dispersed on a triple roller mill. The DBTDL was then mixed in and the mixture was then pasted into a mold and heated to 80° C. for three hours. The resulting flexographic printing plate precursor was imaged by laser ablation and the sensitivity was measured. The resulting image was found to have high spots in the large ablated floor areas that are thought to be a result of ablated debris being re-deposited in those regions. The sensitivity was 0.44 J/cm$^2$/μm.

Invention Example 1

A flexographic printing plate precursor of the present invention was prepared using the Formulation C having the components shown below in TABLE III (all percentages are by weight):

TABLE III

| | |
|---|---|
| Desmodur ® N3300A | 15.39% |
| Mogul ® L carbon black (Cabot Corporation) | 9.11% |
| Cab-O-Sil M5 (fumed silica particles) | 8.15% |
| DBTDL | 0.66% |
| Poly(hexamethylene carbonate) diol | 56.69% |
| GAP (glycidyl azide polymer) | 10.00% |

Formulation C was used to prepare a flexographic printing plate as described for Comparative Example 1, and the sensitivity was determined to be 0.35 J/cm$^2$/μm. Comparison with the flexographic printing plate of Invention Example 1 with that prepared for Comparative Example 2 (Formulation B) indicated that the addition of GAP improved sensitivity, gave a smoother floor, and eliminated re-deposition of ablated debris.

Invention Example 2

Still another flexographic printing plate precursor of this invention was prepared using Formulation D having the components shown below in TABLE IV (all percentages are by weight):

TABLE IV

| | |
|---|---|
| Desmodur ® N3300A | 13.47% |
| Mogul ® L carbon black | 9.11% |
| Cab-O-Sil M5 (fumed silica particles) | 7.13% |
| DBTDL | 0.66% |
| Poly(hexamethylene carbonate) diol | 49.63% |
| Azodicarbonamide | 20.00% |

Formulation D was compounded as described for Comparative Example 1 and the resulting flexographic printing plate was similarly imaged using ablation. A comparison of resulting printing plate of Invention Example 2 with that provided in Comparative Example 2 (Formulation B) showed that the addition of azodicarbonamide to the formulation improved sensitivity, gave a smoother floor, and eliminated re-deposition of debris. The sensitivity of the Invention Example flexographic printing plate precursor was 0.4 J/cm$^2$/μm.

The invention has been described in detail with particular reference to certain preferred embodiments thereof, but it will be understood that variations and modifications can be effected within the spirit and scope of the invention.

The invention claimed is:

1. A laser-engraveable flexographic printing plate precursor comprising an IR laser-engraveable elastomeric layer that comprises a non-free radical crosslinked polymeric binder derived from the reaction of a polyol and a polyisocyanate, an infrared radiation absorbing compound that is responsive to an IR laser for ablative imaging and is present in an amount of at least 1 and up to 20 weight %, and a compound that remains stable in said precursor but upon imaging thermally degrades to produce gaseous products, the IR laser-engraveable elastomeric layer containing no chemistry to generate free radicals.

2. The precursor of claim 1 wherein said non-free radical crosslinked polymeric binder is a polymer derived from the reaction of a diol, triol, or mixture thereof, with a diisocyanate, triisocyanate, or mixture thereof.

3. The precursor of claim 1 wherein said thermally degradable compound contains nitrogen and upon thermal degradation liberates or generates nitrogen gas.

4. The precursor of claim 1 wherein said infrared radiation absorbing compound is carbon black.

5. The precursor of claim 1 further containing fumed silica particles in said laser-engraveable elastomeric layer.

6. The precursor of claim 1 further comprising one or more plasticizers in said laser-engraveable elastomeric layer.

7. The precursor of claim 1 wherein said thermally degradable compound is present in an amount of at least 2 and up to 30 weight %.

8. The precursor of claim 1 wherein upon thermal degradation, said thermally degradable compound liberates or generates carbon dioxide.

9. The precursor of claim 1 wherein upon thermal degradation, said thermally degradable compound produces a mixture of gases.

10. The precursor of claim 1 wherein said thermally degradable compound has one or more azido, nitroso, nitro, nitrate, tetrazole or nitro groups.

11. The precursor of claim 1 wherein said laser-engraveable elastomeric layer has a thickness of from about 0.2 to about 6 mm, and said polymeric binder is present in an amount of from about 20 to about 90 weight %.

12. A method of producing a flexographic printing plate comprising ablative imaging the precursor of claim 1 by exposing it with an IR laser or laser array having a minimum output of at least 3 watts to provide a relief image.

13. The method of claim 12 wherein said exposing laser or laser array comprises laser diodes.

14. A flexographic printing plate obtained by the method of claim 12, from which non-print imaged background regions have been removed and the flexographic printing plate has remaining non-imaged print regions comprising the non-free radical crosslinked polymeric binder derived from the reaction of a polyol and a polyisocyanate and the compound that remains stable in the precursor and in not thermally degraded to produce gaseous products.

15. The method of claim 12 that provides a relief image in the flexographic printing plate having a depth of at least 200 μm.

16. The method of claim 12 that provides a relief image in the flexographic printing plate having a depth of from 300 μm to 1000 μm.

* * * * *